(12) United States Patent
Hussell et al.

(10) Patent No.: US 8,425,271 B2
(45) Date of Patent: Apr. 23, 2013

(54) PHOSPHOR POSITION IN LIGHT EMITTING DIODES

(75) Inventors: Christopher P. Hussell, Cary, NC (US); Michael J. Bergmann, Chapel Hill, NC (US); Brian T. Collins, Raleigh, NC (US); David T. Emerson, Chapel Hill, NC (US)

(73) Assignee: Cree, Inc., Durham, NC (US)

( * ) Notice: Subject to any disclaimer, the term of this patent is extended or adjusted under 35 U.S.C. 154(b) by 229 days.

(21) Appl. No.: 11/839,562

(22) Filed: Aug. 16, 2007

(65) Prior Publication Data
US 2008/0054279 A1    Mar. 6, 2008

Related U.S. Application Data

(60) Provisional application No. 60/824,385, filed on Sep. 1, 2006.

(51) Int. Cl.
*H01J 9/00* (2006.01)
*H01J 9/24* (2006.01)

(52) U.S. Cl.
USPC ............ 445/23; 445/22; 445/58; 313/498; 313/499; 313/501; 313/502; 313/512

(58) Field of Classification Search ......... 313/498–512; 445/24, 22, 23, 58
See application file for complete search history.

(56) References Cited

U.S. PATENT DOCUMENTS

| | | | |
|---|---|---|---|
| 6,066,861 A | 5/2000 | Hohn et al. | |
| 6,257,737 B1 | 7/2001 | Marshall et al. | |
| 6,664,560 B2 | 12/2003 | Emerson et al. | |
| 6,734,033 B2 | 5/2004 | Emerson et al. | |
| 6,936,862 B1 | 8/2005 | Chang et al. | |
| 6,967,116 B2 | 11/2005 | Negley | |
| 7,042,020 B2 | 5/2006 | Negley | |

(Continued)

FOREIGN PATENT DOCUMENTS

| DE | 196 38 667 | 4/1998 |
|---|---|---|
| DE | 697 02 929 | 2/2001 |

(Continued)

OTHER PUBLICATIONS

Schubert, "Light-Emitting Diodes," Cambridge University Press, 2003; pp. 92-96.

(Continued)

*Primary Examiner* — Nimeshkumar Patel
*Assistant Examiner* — Thomas A Hollweg
(74) *Attorney, Agent, or Firm* — Koppel, Patrick, Heybl & Philpott

(57) ABSTRACT

A method of forming an LED lamp with a desired distribution of phosphor is disclosed. The method includes the steps of mixing a plurality of phosphor particles in an uncured polymer resin for which the viscosity can be controlled in response to temperature to form a substantially uniform suspension of the phosphor particles in the resin. The uncured resin is then placed into a defined position adjacent an LED chip and the temperature of the resin is increased to correspondingly decrease its viscosity but to less than the temperature at which the resin would cure unreasonably quickly. The phosphor particles are encouraged to settle in the lowered-viscosity resin to a desired position with respect to the LED chip, and the temperature of the resin is thereafter increased to the point at which it will cured and solidify.

43 Claims, 2 Drawing Sheets

U.S. PATENT DOCUMENTS

| | | | |
|---|---|---|---|
| 7,246,923 B2 | 7/2007 | Conner | |
| 7,259,402 B2 | 8/2007 | Edmond et al. | |
| 2002/0063520 A1 | 5/2002 | Yu et al. | |
| 2003/0080341 A1* | 5/2003 | Sakano et al. | 257/79 |
| 2004/0051111 A1* | 3/2004 | Ota et al. | 257/98 |
| 2004/0100192 A1* | 5/2004 | Yano et al. | 313/512 |
| 2004/0140765 A1 | 7/2004 | Takekuma | |
| 2004/0164311 A1 | 8/2004 | Uemura | |
| 2004/0170018 A1 | 9/2004 | Nawashiro | |
| 2005/0145991 A1 | 7/2005 | Sakamoto et al. | |
| 2005/0167682 A1 | 8/2005 | Fukasawa | |
| 2005/0219835 A1 | 10/2005 | Nagayama | |
| 2005/0221519 A1 | 10/2005 | Leung et al. | |
| 2005/0285494 A1* | 12/2005 | Cho et al. | 313/112 |
| 2006/0060867 A1 | 3/2006 | Suehiro | |
| 2006/0060872 A1 | 3/2006 | Edmond et al. | |
| 2006/0060874 A1 | 3/2006 | Edmond et al. | |
| 2006/0060879 A1 | 3/2006 | Edmond et al. | |
| 2006/0065906 A1 | 3/2006 | Harada | |
| 2006/0102991 A1 | 5/2006 | Sakano | |
| 2006/0119250 A1* | 6/2006 | Suehiro et al. | 313/498 |
| 2006/0138937 A1 | 6/2006 | Ibbetson | |
| 2006/0186429 A1* | 8/2006 | Chew | 257/100 |
| 2006/0186431 A1* | 8/2006 | Miki et al. | 257/100 |
| 2006/0226758 A1* | 10/2006 | Sofue et al. | 313/483 |
| 2006/0226774 A1* | 10/2006 | Sofue et al. | 313/512 |
| 2007/0037307 A1 | 2/2007 | Donofrio | |
| 2007/0092636 A1 | 4/2007 | Thompson et al. | |
| 2007/0160745 A1* | 7/2007 | Park | 427/66 |
| 2007/0269586 A1* | 11/2007 | Leatherdale et al. | 427/66 |

FOREIGN PATENT DOCUMENTS

| | | |
|---|---|---|
| DE | 10 2005 000 800 | 8/2005 |
| DE | 10 2005 013 265 | 12/2005 |
| DE | 10 2005 042 814 | 4/2006 |
| EP | 1 017 112 | 7/2000 |
| JP | 2000-101147 | 4/2000 |
| JP | 2002-076445 | 3/2002 |
| JP | 2003-046141 | 2/2003 |
| JP | 2003-224307 | 8/2003 |
| JP | 2003-234511 | 8/2003 |
| JP | 2004-134699 | 4/2004 |
| JP | 2004-186488 | 7/2004 |
| JP | 2005-167079 | 6/2005 |
| JP | 2006-114637 | 4/2006 |
| JP | 2006-165416 | 6/2006 |

OTHER PUBLICATIONS

Office Action from counterpart Chinese Application No. 20070148326.9, dated Jun. 19, 2009; 2 pgs.

Office Action from foreign counterpart German Application No. 10 2007 040 841.4-33, dated Sep. 17, 2009; with English translation.

Office Action from foreign counterpart German Application No. 10 2007 040 811.2, dated Sep. 17, 2009; with English translation.

Decision of Final Rejection for counterpart Japanese Patent Application No. 2007-216808 dated Jul. 1, 2011.

Office Action in corresponding Japanese Patent Application No. 2011-224055. dated Jan. 12, 2012.

* cited by examiner

PHOSPHOR POSITION IN LIGHT EMITTING DIODES

BACKGROUND

This application claims priority from provisional application Ser. No. 60/824,385 filed Sep. 1, 2006 and from Ser. No. 11/739,307 filed Apr. 24, 2007.

The present invention represents an improvement in the manufacture and structure of light emitting diodes that incorporate phosphors for purposes of color conversion, blending or both.

Light emitting diodes (LEDs) are a class of semiconductor devices that generate photons when a current is passed across a p-n junction. In their fundamental structure, light emitting diodes include at least one p-type layer and one n-type layer that together defined the junction. When current is injected across the junction, electrons and holes recombine and can create photons. In accordance with well-understood principles of electronics and physics, the wavelength (and thus the frequency) of the photons is based upon the energy change of the recombination. In turn, the energy is either defined or constrained by the bandgap of the semiconductor material i.e., the energy difference between the material's valence band and its conduction band.

As a result, the color emitted by an LED is largely defined by the material from which it is formed. Diodes formed of gallium arsenide (GaAs) and gallium phosphide (GaP) tend to emit photons in the lower energy red and yellow portions of the visible spectrum. Materials such as silicon carbide (SiC) and the Group III nitrides have larger bandgaps and thus can generate photons with greater energy that appear in the green, blue and violet portions of the visible spectrum as well as in the ultraviolet portions of the electromagnetic spectrum.

In some applications, an LED is more useful when its output is moderated or converted to a different color. In particular, as the availability of blue-emitting LEDs has greatly increased, the use of yellow-emitting phosphors that convert the blue photons has likewise increased. Specifically, the combination of the blue light emitted by the diode and the yellow light emitted by the phosphor can create white light. In turn, the availability of white light from solid-state sources provides the capability to incorporate them in a number of applications, particularly including illumination and as backlighting for color displays. In such devices (e.g., flat computer screens, personal digital assistants, and cell phones), the blue LED and yellow phosphor produce white light which is then distributed in some fashion to illuminate the color elements (often formed by liquid crystals, "LCDs").

In the present application, the term "white light" is used in a general sense. Those familiar with the generation of colors and of color perception by the human eye will recognize that particular blends of frequencies can be defined as "white" for precise purposes. Although some of the diodes described herein can produce such precise output, the term "white" is used somewhat more broadly herein and includes light that different individuals or detectors would perceive as having a slight tint toward, for example, yellow or blue.

Many of the phosphors used in conjunction with LEDs are fine particles of fluorescent compositions that are positioned adjacent the LED chip. In the most typical example, the LED chip is mounted on a circuit board or other electrical connection (e.g., a lead frame) and is encapsulated by a substantially transparent material that forms a lens. Most typically, the lens is a polymer, very often an epoxy or a silicone. When a phosphor is incorporated, it is typically introduced as a suspension in the resin. The suspension is then applied to the LED and cured. The resulting package (chip, electrical leads, lens) is often referred to as an LED lamp.

Because the phosphor is made up of particles and because it is distributed in the resin, its physical position with respect to the LED chip can affect the LED's efficiency and output. When the distribution of the phosphor particles in the resin cannot be properly controlled, the resulting LED lamp may suffer from a less suitable output than its physical and electronic properties could otherwise provide.

As the use of blue LEDs in conjunction with yellow phosphors has increased, it has become evident that certain resins, including many epoxy resins, are less suitable for such higher energy devices because they are more easily prone to photochemical reactions (unfortunately mostly resulting in degradation) when exposed to blue and higher energy photons.

As another factor, adding phosphor particles to a polymer resin and then applying the phosphor-containing resin to the LED chip requires a series of manufacturing steps. Generally speaking, the resin has to be prepared in a liquid form so that it can be cast or otherwise formed into the desired package shape. Additionally, the phosphor has to be mechanically mixed with the resin in such liquid form so that it can be incorporated in the package. For practical manufacturing purposes, the resin should have a reasonable "pot life;" i.e., the time interval during which it can be worked before it starts to cure.

Accordingly, a need exists for combinations of phosphors and resins, and techniques for handling phosphors and resins, that enhances, rather than complicates, the process for manufacturing light emitting diode lamps.

SUMMARY

The invention is a method of selecting, mixing, manipulating, and curing a phosphor-carrying resin to produce a desired position of the phosphor with respect to an LED chip in a lamp package.

The foregoing and other objects and advantages of the invention and the manner in which the same are accomplished will become clearer based on the followed detailed description taken in conjunction with the accompanying drawings.

DETAILED DESCRIPTION

Figure 1:
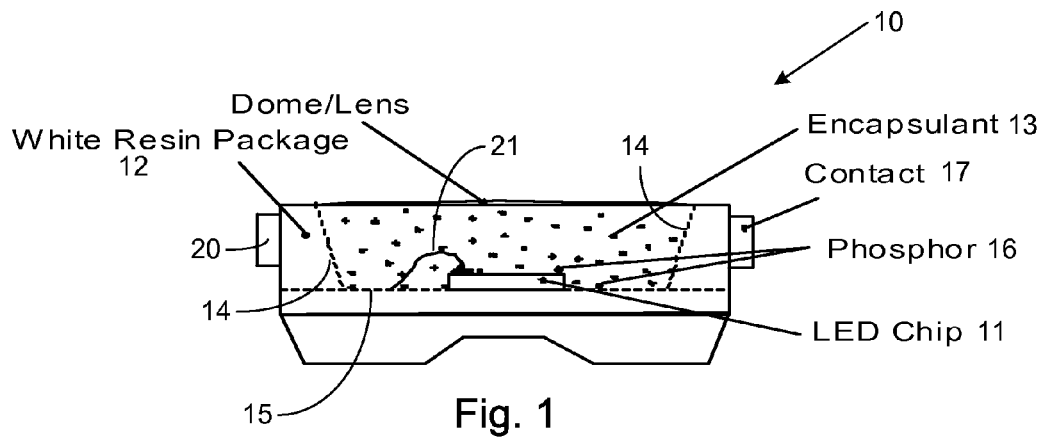
FIG. 1 is a cross-sectional view of an LED package with a suspension of encapsulant and phosphor.

The present invention is a process that matches the properties of a resin and a phosphor to control the desired location of the phosphor in the device.

In a first aspect, the invention comprises selecting a resin that is inert or minimally reactive in the presence of photons in the green, blue and ultraviolet portions of the electromagnetic spectrum. Although in many LED lamp packages, epoxy resins are used for the lamp package, such resins tend to be relatively easily (in comparative terms) affected by higher energy photons; i.e., they tend to undergo photochemical degradation reactions in the presence of such photons. Accordingly, they are less desirable for such light emitting diodes, regardless of whether or not they also incorporate a color conversion phosphor.

In accordance with the present invention, it has been found that polysiloxane-based resins (often referred to as "silicone" resins) are appropriate because they are less susceptible to photochemical degradation. In general, the term polysiloxane refers to any polymer constructed on a backbone of —(—Si—O—)$_n$—; (typically with organic sidegroups).

Such resins are (or can be selected as being) optically clear over a wide range of wavelengths (including most of the visible spectrum). Depending upon the particular functional group chemistry, properties such as hardness (Durometer), curing characteristics, tensile strength, coefficient of thermal expansion, and volatile content (among other physical and chemical characteristics) can be selected or controlled as needed or desired. A useful description of this technology is set forth in Riegler, INDEX MATCHING SILICONE FOR HIGH BRIGHTNESS LED PACKAGING, LEDs Magazine, February 2006 (www.ledsmagazine.com). See also, Information About Dow Corning® Brand LED Materials (www.dow-corning.com, Midland, Mich. USA). In addition to Dow Corning, representative polysiloxanes are available from GE Advanced Materials Silicones (Wilton Conn., USA) and NuSil Silicone Technology (Carpinteria, Calif. USA).

As a second aspect, the resin must demonstrate viscosity characteristics that can be reasonably moderated as a function of temperature prior to curing. In this regard, it will be understood that when most thermosetting resins are in a precursor or uncured state, they will begin to cure (even if very slowly) regardless of temperature. Thus, a resin that normally requires heat to set within a reasonable period of time will in reality begin setting at more moderate temperatures (e.g. room temperature) but over time periods that are unacceptably slow for commercial production.

Alternatively, other resins will cure unacceptably fast, and thus offer little latitude for viscosity control using temperature. If the viscosity is too high, the phosphor will not migrate in a useful fashion.

Preferred resins will demonstrate a range of viscosity over a useful range of temperatures. Increasing the temperature of such resins will decrease their viscosity sufficiently for the intended purpose but without rapidly curing the resin. The resin will, however, cure in a more rapid fashion when the temperature is increased further within the useful range. Thus, at a first elevated temperature, the resin will remain uncured with a reasonable pot life at a desired decreased viscosity. At a further (higher) elevated temperature, the resin will beneficially cure as desired.

This permits a two-step process in which the resin and phosphor are mixed to form the desired suspension at a relatively moderate temperature (potentially including room temperature). Then, the suspension is cast into the mold or in some cases the lamp package containing the LED chip. While in the liquid state, the resin-phosphor suspension is raised to a moderate temperature at which the viscosity of the resin decreases sufficiently to allow the phosphor to migrate (under the influence of gravity) to the desired position within the package, often (but not necessarily exclusively) covering the LED chip and the adjacent horizontal surfaces.

In the final step, the resin is raised to a temperature sufficient to cure it and form a solid with the phosphor in the desired position.

Although the drawings illustrate the desired position for the phosphor as being on the floor of the package, it will be understood that the viscosity control described herein can be used in conjunction with other techniques to position the phosphor other than on the floor of the package. For example, by adding a small amount of resin and allowing it to cure, a surface other than the floor can be defined to which phosphor can migrate when it is added with the uncured resin.

In another aspect, the invention comprises controlling the size composition of the phosphor particles. In general, for any given viscosity, and under the influence of gravity (or another force such as a centripetal force), larger (heavier) particles will migrate more readily under the influence of gravity then will lighter (smaller) particles. As one extreme, if the particles are sufficiently small, the molecular motion of the resin will substantially balance the force of gravity and the particles will simply remain suspended for unreasonably long periods of time. Thus, the particle size of the phosphor must be selected and controlled to move as desired under the influence of gravity at the viscosity of the resin at the intermediate temperature.

Color conversion phosphors are well understood to persons of ordinary skill in this art, and will not be discussed in detail herein. A common and widely available yellow conversion phosphor is formed of cerium-doped yttrium-aluminum-garnet (YAG:Ce) and when using the silicone-based resins described above, an average particle size of about six microns (the largest dimension across the particle) will be appropriate.

In general, the resin and phosphor suspension should have a pot life of about several hours at room temperature. For the silicone-based resins described herein, a temperature of about 70° C. is appropriate to allow the phosphor to settle over a period of between about 30 minutes and one hour. Although the resin would eventually cure after hours of heating at 70° C., the amount of time before curing at such temperature is more than enough to allow the phosphor to settle appropriately. Then, the temperature can be raised to a more appropriate curing temperature (e.g. about 140-150° C.) for about one hour to finish the curing step. Although pot life is somewhat subjective, a pot life of more than eight hours is more than sufficient for most LED packaging processes. In some cases, a pot life as short as 15 minutes will be appropriate, but a pot life shorter than about five minutes is generally unacceptable.

Stated differently, the method can be described as selecting and mixing a combination of a phosphor and a resin into a suspension that will remain homogeneous at a moderate temperature for a time interval sufficient to permit the suspension to be dispensed into an appropriate lamp package. The potential packages are oriented in a manner that allows the phosphor to settle to a desired position when the temperature is raised to an intermediate higher temperature (and lowers the resin viscosity) for an appropriate time interval. Finally, once the phosphor is in place, the temperature is raised to a point at which the resin cures within an appropriate time interval.

FIG. 1 is a cross-sectional view of a packaged diode according to the present invention illustrating the phosphor 16 as being suspended in the encapsulant 13 prior to the step of heating the resin to decrease its viscosity. The embodiment illustrated is representative of a side view surface mount application (also referred to as a "side looker"). The packaged diode is broadly designated at 10 and includes the LED chip 11 on a package 12 which is typically formed of a white polymer resin for maximum light reflection purposes. An encapsulant 13 (e.g., a polysiloxane as referred to above) fills a recess formed by the side walls 14 and 15 of the package 12. The phosphor is indicated as the black dots 16. Appropriate electrical contacts 17 and 20 are provided for the LED chip 11 potentially along with a wire 21.

Figure 2:
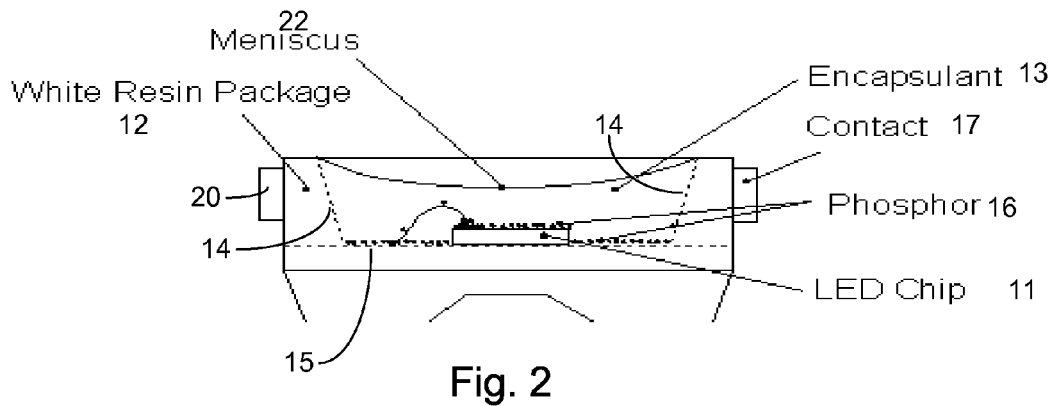
FIG. 2 is a cross-sectional view of a LED package according to the invention and illustrating a concave meniscus.
Figure 3:
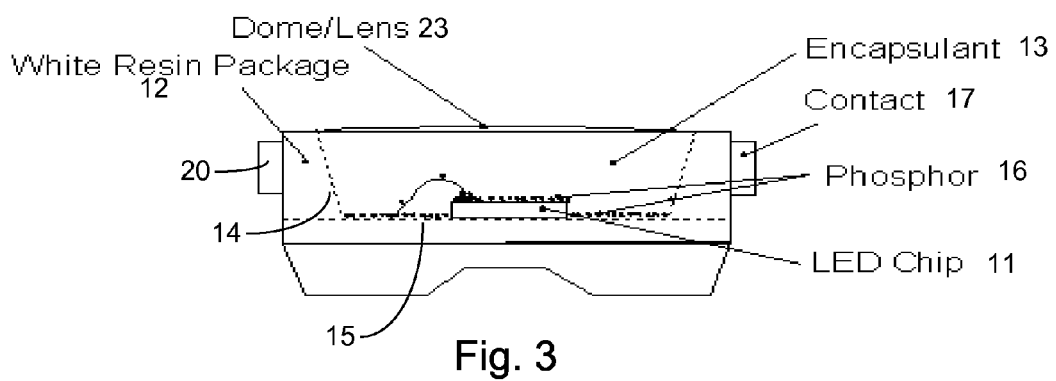
FIG. 3 is a cross sectional view of an LED package according to the invention and illustrating a flat or slightly convex meniscus.

FIGS. 2 and 3 illustrate two embodiments of the invention after the phosphor 16 has been allowed to settle. Like elements carry like reference numerals as in FIG. 1. As illustrated in FIG. 2, the encapsulant 13 no longer carries the majority of the phosphor 16 in suspension, and has been cured to a concave meniscus 22. The phosphor 16 is located on the chip 11 and along the floor 15 of the package 12 (with the floor typically including at least one metal contact).

FIGS. 1 through 3 illustrate exemplary rather than limiting orientations, and it will be understood that if it is desired to have the phosphor settle against a different wall or in a different position, the package can be oriented in a manner that encourages the phosphor to move in that fashion. For example, if the goal were to have all of the phosphor at the top of the meniscus, the process could be conducted with the chip in an upside down orientation as compared to FIGS. 1 through 3.

In FIGS. 1, 2, and 3, the LED chip 11 can be any appropriate light emitting diode, and the invention is particularly advantageous with respect to blue light emitting diodes, including those available from Cree, Inc. (Durham, N.C. USA), the assignee of the present invention. Persons of ordinary skill in the art are, however, well aware of a wide variety of light emitting diodes and thus the Cree diodes are offered as exemplary rather than limiting of diodes that can be used in accordance with the present invention.

FIG. 3 illustrates an embodiment similar to FIG. 2, but with the meniscus 23 forming a flat surface or a slight dome. The advantages of the flat or slightly domed (but not spherical or hemispherical) meniscus are set forth in commonly assigned application Ser. No. 60/824,390, filed Sep. 1, 2006 for "Encapsulant Profile for Light Emitting Diodes," the contents of which are incorporated entirely herein by reference. The remainder of the respective elements and their positions elements in FIG. 3 are the same as in FIG. 2.

Figure 4:
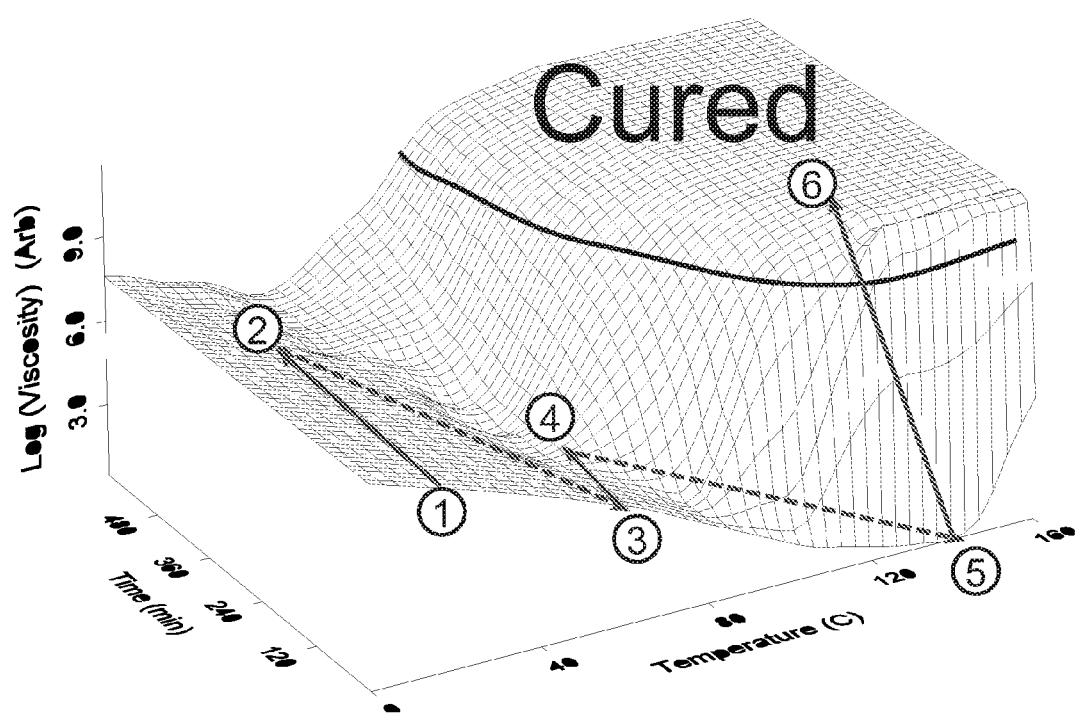
FIG. 4 is a combination plot of viscosity, time and temperature characteristics of an exemplary resin according to the invention.

FIG. 4 is a three-dimensional plot that illustrates the method aspects of the invention. Time and temperature are plotted on perpendicular horizontal axes while viscosity (in arbitrary log units) is plotted vertically. The time of the periods between digits 2 and 3 and between digits 4 and 5 (represented by dashed lines) is not shown by the graph; thus, the periods beginning at digits 1, 3, and 5 are all shown as starting at 0 minutes for simplicity. The resulting three-dimensional image represents the behavior of the resin at numerous points of time, temperature and viscosity. Thus, when starting at the corner of time and temperature, increasing the temperature to about 80° C. or above for one or two hours will result in a cured resin (i.e., the plateau). Alternatively, if the temperature is maintained relatively moderate, a great deal of time can expire without producing a cured resin.

FIG. 4 illustrates, however, that increasing the temperature more moderately, i.e., between about 40° and 80° C., reduces the viscosity of the resin as compared to room temperature. Thus, FIG. 4 illustrates an temperature-viscosity image analogous to a valley between about room temperature and 80° C.

Accordingly, in an exemplary embodiment of the invention, the resin and phosphor are first mixed at a time and temperature (about 40° C.) represented by the digit 1 in FIG. 4. A portion of the pot life is represented by the arrow between the digits 1 and 2. The dotted line between digits 2 and 3 represents the step of heating the resin to the temperature (between about 40° and 80° C. in this embodiment) at which the viscosity decreases sufficiently for the phosphor to settle. The line between digits 3 and 4 represents the time interval during which the phosphor is permitted to settle while the resin remains at the lower viscosity. There is, of course, no hypothetical upper limit to the time over which the phosphor is permitted to settle, but intervals as short as 10 minutes or as long as five hours can be appropriate, with 30 minutes to one hour being more typical.

The line between digits 4 and 5 represents the step of increasing the temperature to the point at which the resin will cure relatively rapidly (e.g., commonly between about 100°-200° C. and about 140° C. in the illustrated embodiment) and the curing itself is represented by the line between the digits 5 and 6.

It will be understood that if curing the resin were the only object, the resin could be cured by going from position 1 to position 6 in as direct a manner as possible; for example by heating the resin to about 120° C. for a period of about two hours. The invention, however, represents recognition that by using the properties of the resin in the manner illustrated by FIG. 4, the position of the phosphor in the final lamp package can be advantageously controlled.

In the drawings and specification there has been set forth a preferred embodiment of the invention, and although specific terms have been employed, they are used in a generic and descriptive sense only and not for purposes of limitation, the scope of the invention being defined in the claims.

The invention claimed is:

1. A method of forming an LED lamp with a desired distribution of phosphor, the method comprising:
    selecting a desired position of phosphor particles with respect to an LED chip;
    selecting a particle size of a plurality of phosphor particles based on a viscosity of an uncured polymer resin in response to temperature changes and based on said desired position of the phosphor particles with respect to the LED chip;
    mixing a plurality of phosphor particles in the uncured polymer resin for which the viscosity can be controlled in response to temperature to form a substantially uniform suspension of the phosphor particles in the resin;
    placing the uncured resin into a defined position adjacent the LED chip;
    increasing the temperature of the resin in a first step to a temperature that correspondingly decreases the viscosity of the resin without immediately curing the resin;
    encouraging the phosphor particles to settle in the lowered-viscosity resin to the desired position with respect to the LED chip; and
    in response to the phosphor particles having settled at the desired position, thereafter increasing the temperature of the substantially uncured resin in a second step to a temperature higher than the first step and at which it will cure and solidify in about two hours or less.

2. A method according to claim 1 comprising incorporating a resin that is less susceptible to photochemical reactions when exposed to light in the blue or higher energy portions of the electromagnetic spectrum.

3. A method according to claim 2 comprising incorporating a polysiloxane resin.

4. A method according to claim 1 comprising incorporating a phosphor with a particle size that will remain suspended in the resin at temperatures of about 40° C. or less, but that will settle within a reasonable period of time when the viscosity of the resin decreases.

5. A method of forming an LED lamp according to claim 1 wherein the step of mixing the phosphor particles comprises mixing particles of cerium doped yttrium aluminum garnet in the uncured polymer resin.

6. A method of forming an LED lamp according to claim 5 comprising mixing phosphor particles with an average particle size of about six microns.

7. A method of forming an LED lamp according to claim 1, comprising mixing the phosphor particles and the uncured polymer resin at a temperature of between about 25° and 40° C. prior to the step of placing the resin into the defined position adjacent the LED chip; and
further comprising the step of increasing the temperature of the resin to between about 40° and 80° C. following the step of placing the uncured resin into the defined position.

8. A method of forming an LED lamp according to claim 1 wherein the step of increasing the temperature of the resin to the point at which it will cure comprises heating the resin to a temperature of between about 100° and 200° C.

9. A packaged light emitting diode formed by the method of claim 1.

10. A display that incorporates a packaged light emitting diode according to claim 9.

11. A display according to claim 10 that incorporates the packaged light emitting diode in combination with a light guide.

12. A method according to claim 1, wherein increasing the temperature of the resin in the first step comprises increasing the temperature within a temperature range that has a maximum value of less than 100° C.

13. A method according to claim 1, wherein selecting the particle size of the phosphor particles comprises selecting the particle size for controlling a migration of the phosphor particles during the first step.

14. A method according to claim 1, wherein increasing the temperature of the resin in the first step comprises increasing the temperature within a temperature range that has a maximum value of less than 100° C. and a minimum value at room temperature.

15. A method according to claim 1, comprising selecting a time interval for permitting the phosphor particles to settle at the desired position.

16. A method according to claim 15, wherein the time interval has a minimum value of about 10 minutes and a maximum value of about 5 hours.

17. A method of forming an LED lamp according to claim 1 comprising mixing the phosphor particles and the uncured polymer resin at a temperature of between about 25° and 40° C. prior to the step of placing the resin into the defined position adjacent the LED chip.

18. A method of forming an LED lamp comprising:
selecting a desired position of the phosphor with respect to an appropriate lamp package;
selecting a particle size of a phosphor based upon an intermediate temperature that lowers a viscosity of a resin for a time sufficient for the phosphor to settle to the desired position without rapidly curing the resin;
selecting and mixing a combination of a phosphor and a resin into a suspension that will remain homogeneous at a temperature of about 40° C. or less for a time interval sufficient to permit the suspension to be dispensed into the appropriate lamp package;
dispensing the homogeneous mixture of phosphor and resin into a lamp package;
orienting the lamp package in a manner that allows the phosphor to settle to a desired position when the temperature is raised to an intermediate higher temperature that lowers the resin viscosity;
raising the temperature to the intermediate higher temperature that lowers the resin viscosity for a time sufficient for the phosphor to settle to the desired position without rapidly curing the resin; and
in response to the phosphor having settled at the desired position, raising the temperature to a point at which the substantially uncured resin cures within between about 5 minutes and 5 hours with the phosphor in the desired position.

19. A method of forming an LED lamp according to claim 18 comprising mixing a combination of a cerium doped yttrium aluminum garnet phosphor and a polysiloxane resin into the homogeneous suspension.

20. A method of forming an LED lamp according to claim 19 comprising mixing a phosphor that has an average particle size of about six microns.

21. A method of forming an LED lamp according to claim 18 wherein the step of orienting the lamp package comprises orienting the lamp package in a manner that settles the phosphor over and on the LED chip.

22. A method according to claim 18 wherein the step of raising the temperature to a point at which the resin cures comprises raising the temperature to between about 100° and 200° degrees centigrade.

23. A method according to claim 18, wherein raising the temperature to the intermediate higher temperature comprises raising the temperature within a temperature range that has a maximum value of less than 100° C.

24. A method according to claim 18 wherein selecting the particle size of the phosphor comprises selecting the particle size for controlling a migration of the phosphor during the step of raising the temperature to the intermediate higher temperature.

25. A method according to claim 18, wherein raising the temperature to the intermediate higher temperature comprises raising the temperature within a temperature range that has a maximum value of less than 100° C. and a minimum value at room temperature.

26. A method according to claim 18, comprising selecting a time interval for permitting the phosphor to settle at the desired position.

27. A method according to claim 26, wherein said time interval has a minimum value of about 10 minutes and a maximum value of about 5 hours.

28. A method according to claim 18 wherein the step of mixing the phosphor and the resin is carried out at about room temperature.

29. A method according to claim 18 wherein the step of raising the temperature to the intermediate higher temperature comprises raising the temperature to between about 40° and 80° C.

30. A method of forming an LED lamp with a desired distribution of phosphor, the method comprising:
selecting a desired position of phosphor particles with respect to an LED chip;
selecting a particle size of a plurality of phosphor particles based upon a temperature that correspondingly decreases a viscosity of an uncured polymer resin and based on the desired position of the phosphor particles with respect to the LED chip;
mixing the plurality of phosphor particles in the uncured polymer resin for which the viscosity can be controlled in response to temperature to form a substantially uniform suspension of the phosphor particles in the resin;
placing the uncured resin into a defined position adjacent the LED chip;
increasing the temperature of the resin in a first step to a temperature that correspondingly decreases the viscosity of the resin but that is less than the temperature at which the resin would cure unreasonably quickly;

encouraging the phosphor particles to settle in the lowered-viscosity resin to the desired position with respect to the LED chip for a period of at least about 10 minutes; and in response to the phosphor particles having settled at the desired position, thereafter increasing the temperature of the substantially uncured resin to the point at which it will cure and solidify.

31. A method according to claim 30 comprising incorporating a polysiloxane resin.

32. A method according to claim 30 comprising incorporating a phosphor with a particle size that will remain suspended in the resin at temperatures of about 40° C. or less, but that will settle within a reasonable period of time when the viscosity of the resin decreases.

33. A method of forming an LED lamp according to claim 30 wherein the step of mixing the phosphor particles comprises mixing particles of cerium doped yttrium aluminum garnet in the uncured polymer resin.

34. A method of forming an LED lamp according to claim 33 comprising mixing phosphor particles with an average particle size of about six microns.

35. A packaged light emitting diode formed by the method of claim 30.

36. A method according to claim 30, wherein increasing the temperature of the resin in the first step comprises increasing the temperature within a temperature range that has a maximum value of less than 100° C.

37. A method according to claim 30, wherein selecting a particle size of the phosphor particles comprises selecting the particle size for controlling a migration of the phosphor particles during the first step.

38. A method according to claim 30, wherein increasing the temperature of the resin in the first step comprises increasing the temperature within a temperature range that has a maximum value of less than 100° C. and a minimum value at room temperature.

39. A method according to claim 30, comprising selecting a time interval for permitting the phosphor particles to settle at the desired position, said time interval having a minimum value of about 10 minutes.

40. A method according to claim 39, wherein said time interval has a maximum value of about 5 hours.

41. A method of forming an LED lamp according to claim 30 comprising mixing the phosphor particles and the uncured polymer resin at a temperature of between about 25° and 40° C. prior to the step of placing the resin into the defined position adjacent the LED chip.

42. A method of forming an LED lamp according to claim 41 comprising the step of increasing the temperature fo the resin to between about 40° and 80° C. following the step of placing the uncured resin into the defined position.

43. A method of forming an LED lamp according to claim 30 wherein the step of increasing the temperature of the resin to the point at which it will cure comprises heating the resin to a temperature of between about 100° and 200° C.

* * * * *